United States Patent [19]
Koshido et al.

[11] Patent Number: 6,156,672
[45] Date of Patent: Dec. 5, 2000

[54] METHOD OF FORMING DIELECTRIC THIN FILM PATTERN AND METHOD OF FORMING LAMINATE PATTERN COMPRISING DIELECTRIC THIN FILM AND CONDUCTIVE THIN FILM

[75] Inventors: Yoshihiro Koshido; Kei Fujibayashi, both of Shiga-ken; Yuji Toyota, Kanazawa; Tadayuki Okawa, Omihachiman; Ryoichiro Takahashi, Tokyo-to, all of Japan

[73] Assignee: Murata Manufacturing Co., Ltd., Japan

[21] Appl. No.: 09/443,671

[22] Filed: Nov. 19, 1999

[30]       Foreign Application Priority Data

Nov. 27, 1998    [JP]    Japan .................................. 10-337868

[51] Int. Cl.⁷ .................................................. H01L 21/31
[52] U.S. Cl. .......................... 438/778; 438/785; 438/951
[58] Field of Search ...................................... 438/778, 785, 438/951

[56]                References Cited

U.S. PATENT DOCUMENTS 5,190,892    3/1993    Sano ......................................... 437/180

*Primary Examiner*—John F. Niebling
*Assistant Examiner*—Alexander G. Ghyka
*Attorney, Agent, or Firm*—Ostrolenk, Faber, Gerb & Soffen, LLP

[57]                    ABSTRACT

A method of forming a dielectric thin film pattern, comprises the steps of: depositing a dielectric thin film on a substrate having a resist pattern thereon by a vapor deposition method, wherein as a material for the dielectric thin film, at least one of $CeO_2$, $Sm_2O_3$, $Dy_2O_3$, $Y_2O_3$, $TiO_2$, $Al_2O_3$, and $MgO$ is used; and removing the resist pattern whereby the dielectric thin film is patterned.

6 Claims, 1 Drawing Sheet

METHOD OF FORMING DIELECTRIC THIN FILM PATTERN AND METHOD OF FORMING LAMINATE PATTERN COMPRISING DIELECTRIC THIN FILM AND CONDUCTIVE THIN FILM

BACKGROUND OF THE INVENTION

1. Field of the Invention

The present invention relates to a method of forming a dielectric thin film pattern and a method of forming a laminate pattern. In particular, the present invention relates to a method of forming a low loss dielectric thin film pattern by using lift-off technology. Further, the present invention preferably relates to a method of forming a laminate pattern composed of a dielectric thin film and a conductive thin film and constituting a high frequency device such as a high frequency transmission line, a high frequency resonator, a high frequency capacitance element, etc.

2. Description of the Related Art

A low dielectric loss is required for dielectric thin films which constitute high frequency devices such as high frequency transmission lines, high frequency resonators, high frequency capacitance elements, etc. For this reason, technologies such as CVD, sputtering, ablation, etc. have been used to form dielectric thin films with a low dielectric loss. Vapor deposition methods have never been used for this purpose. One of the reasons that vapor deposition methods have not been used is in that according to the vapor deposition technology, the energy of a vapor deposition particle is low (not more than about 1 eV) so that it is difficult to tightly-form a dielectric thin film exhibiting low loss.

It has been generally assumed that when the temperature of a substrate is about room temperature, a low loss film can not be produced using vapor deposition technology. In order to obtain a low loss film using vapor deposition technology, it has been necessary to either heat the substrate, or utilize ion assist, ion plating, etc. However, according to each of these methods, the substrate must be heated to a high temperature. Because of the heat resistances of photoresists used in the lift-off technology, it has been impossible to form a low loss thin film using lift-off technology.

In the case that a laminate pattern (wiring pattern) composed of a dielectric thin film and a conductor thin film is partially formed on a substrate, for example, a laminate pattern comprising a dielectric thin film and a conductor thin film and constituting a high frequency capacitance element having a MIM (metal—insulator metal) structure, ordinarily, the laminate pattern has been produced according to the methods described below.

According to a first method, a conductor thin film is formed as a lower layer on the overall surface of a substrate by vapor deposition, sputtering, or the like. Subsequently, a dielectric thin film is formed by CVD, sputtering, ablation, or the like. Then, a conductor thin film is formed as an upper layer by vapor deposition, sputtering, or the like, whereby a laminate film having an MIM structure is formed. Thereafter, a resist pattern is formed thereon. The laminate film lying in an unnecessary area, exposed through the resist pattern, is removed by etching to obtain a laminate pattern.

A second method is as follows. First, a conductor thin film is formed as a lower layer on the overall surface of a substrate by vapor deposition, sputtering, or the like. Thereafter, a resist pattern is formed thereon, and only the conductor film as the lower layer is etched to be patterned in a desired pattern. Otherwise, a resist pattern is formed previously in an area where the conductor thin film is not required. The conductor thin film is formed as the lower layer on the substrate via the resist pattern by vapor deposition or the like. The conductor thin film formed on the resist pattern is separated from the substrate together with the resist pattern. Thus, the conductor thin film as the lower layer is patterned using lift-off technology. Subsequently, a dielectric thin film is formed on the whole surface of the substrate and on the patterned conductor thin film as the lower layer by CVD, sputtering, ablation, or the like. A resist pattern is formed on the dielectric thin film, and the area where the dielectric thin film is not required is removed by etching. Further, in the same manner as employed for the formation of the conductor thin film as the lower layer, a conductor thin film if formed as an upper layer on the dielectric thin film, and patterned. When the dielectric thin film and the conductor thin film as the upper layer are patterned, they are registered with the conductor thin film as the lower layer and the dielectric thin film which are already patterned, respectively, and then, patterned to have the same pattern shape.

However, the first and the second methods have the problem that a dielectric material such as $Al_2O_3$ or the like can not be etched with a high precision even if dry etching such as RIE or the like is used. For this reason, when the formation of a high precision dielectric thin film pattern is desired, the dielectric thin film materials which are available using any of these methods are extremely limited. In some cases, the dielectric thin film materials can be mechanically removed by ion milling or the like. However, in this case, damage to underlying materials is problematic.

As regards to dielectric thin film materials capable of being etched, the etching is expensive, since a resist pattern is formed, and then, etching is carried out by use of a resist pattern as a mask. In particular, according to the second method, it is necessary to pattern the resist film three times, which is highly costly.

For the above-described reasons, there has been a need for a single method for forming a low loss dielectric thin film pattern or a laminate pattern composed of a low loss dielectric thin film and a conductor thin film using lift-off technology. In particular, it has been desired that a laminate pattern composed of a low loss dielectric thin film and a conductor thin film be produced using lift-off technology where the conductor thin film and the dielectric thin film are vapor-deposited on one resist pattern layer, one after the other under vacuum conditions.

SUMMARY OF THE INVENTION

The present invention can solve the aforementioned problems associated with the conventional art and provides a method of forming a laminate pattern in which the laminate pattern composed of a low loss dielectric thin film and a conductor thin film and constituting a high frequency device such as a high frequency transmission line, a high frequency resonator, a high frequency capacitance element, and so forth, can be easily formed using lift-off technology.

The method of forming a dielectric thin film pattern, comprises the steps of: depositing a dielectric thin film on a substrate having a resist pattern thereon by a vapor deposition method, wherein as a material for the dielectric thin film, at least one of $CeO_2$, $Sm_2O_3$, $Dy_2O_3$, $Y_2O_3$, $TiO_2$, $Al_2O_3$, and $MgO$ is used; and removing the resist pattern whereby the dielectric thin film is patterned.

The temperature of the substrate employed during the deposition of the dielectric thin film by the vapor deposition method is preferably not more than 150° C.

The method of forming a dielectric thin film pattern may further comprises the step of subjecting the patterned dielectric thin film to heat treatment at a temperature of 150° C. or more.

For the purpose of illustrating the invention, there is shown in the drawings several forms which are presently preferred, it being understood, however, that the invention is not limited to the precise arrangements and instrumentalities shown.

DETAILED DESCRIPTION OF PREFERRED EMBODIMENTS

Figure 1A:
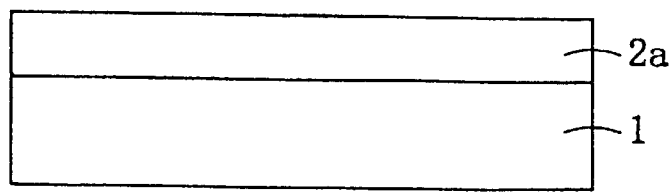
FIGS. 1A through 1F are cross-sectional view illustrating specific process steps of a method of forming a wiring pattern according to an embodiment of the present invention.
Figure 1B:
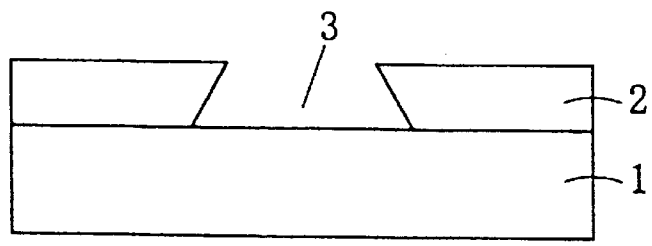

A method of forming a dielectric thin film pattern according to an embodiment of the present invention comprises the steps of depositing a dielectric thin film on the substrate, forming a resist pattern thereon using a vapor deposition method and removing the resist pattern to form a patterned dielectric thin film, wherein a material used for the dielectric thin film is at least one of $CeO_2$, $Sm_2O_3$, $Dy_2O_3$, $Y_2O_3$, $TiO_2$, $Al_2O_3$, and MgO. In this case, as the vapor deposition method, electron beam vapor deposition, resistance heating vapor deposition, high frequency induction heating vapor deposition or the like may be used.

As a result of the intensive study by the inventors, it has been determined that with the seven types of materials, that is, with $CeO_2$, $Sm_2O_3$, $Dy_2O_3$, $Y_2O_3$, $TiO_2$, $Al_2O_3$, and MgO, a low loss dielectric thin film can be formed by vapor deposition at room temperature. Accordingly, when a dielectric thin film is formed using one or more of these materials, the temperature of a substrate during the film-formation can be prevented from exceeding the heat resistance temperature of the resist pattern, and the heat distortion or degradation of the resist pattern at film-formation can be avoided.

When a dielectric thin film pattern is formed according to the present invention, a low loss dielectric thin film can be formed at a temperature of the substrate which is lower than the heat resistance temperature of the resist pattern, using lift-off technology. In addition, dielectric thin films incapable of being etched can be patterned. Further, the present method is inexpensive as compared with the case where a resist pattern is formed after the formation of a dielectric thin film, and the dielectric thin film is patterned.

In the method of forming a dielectric thin film pattern, the temperature of the substrate employed when the dielectric thin film is vapor-deposited on the substrate and the resist pattern is preferably not more than 150° C.

Ordinarily, the heat resistance temperature of the resist pattern is 150° C. Accordingly, when the substrate temperature during film-formation is up to 150° C., heat distortion, degradation, and so forth of the resist pattern can be avoided. As described above, the formation of a low loss dielectric thin film by the liftoff technology is made possible.

In the method of forming a dielectric thin film pattern, the dielectric thin film pattern is preferably heat-treated at a temperature of at least 150° C. after the dielectric thin film on the resist pattern is removed together with the resist pattern.

The dielectric loss of the dielectric thin film pattern can be further improved by the heat treatment of the dielectric thin film pattern at a temperature of 150° C. or higher after the dielectric thin film pattern is formed using lift-off technology. Preferably, the heat treatment is carried out under vacuum or in an oxygen atmosphere. In particular, since any of the above-described dielectric thin film materials is an oxide film, there is the danger that oxygen contained in the dielectric thin film will be removed during heat treatment. In order to prevent the removal of oxygen, it is desirable to carry out the heat treatment in an oxygen atmosphere.

The method of the forming a dielectric thin film pattern is suitably incorporated into a method of forming a laminate pattern comprising a dielectric thin film and a conductive thin film. That is, the method of forming a laminate pattern comprises the steps of: forming a resist pattern on a substrate; sequentially depositing a dielectric thin film and a conductor thin film on the substrate having the resist pattern; and removing the resist pattern whereby the laminate pattern comprising the dielectric thin film and the conductor thin film is produced, wherein as a material for the dielectric thin film, at least one of $CeO_2$, $Sm_2O_3$, $Dy_2O_3$, $Y_2O_3$, $TiO_2$, $Al_2O_3$, and MgO is used.

According to the preferred method, the formation of both of the conductor thin film and the dielectric thin film is enabled using the vapor deposition method. Thus, the conductor thin film and the dielectric thin film can be formed continuously in the same vapor deposition apparatus. That is, the laminate pattern composed of the conductor thin film and the dielectric thin film can be formed simultaneously by the lift-off technology. Thus, according to this method, a laminate pattern composed of a conductor thin film and a dielectric thin film can be formed inexpensively and with high precision, inexpensively.

In the case where the laminate pattern comprising a dielectric thin film and a conductive thin film is formed, it is desirable that the heat treatment is carried out under vacuum or in an inert gas atmosphere such as Ar, He, Ne, Xe, $N_2$ gas, and so forth so that the conductor thin film will not be oxidized.

Hereinafter, the preferred embodiments of the present invention are explained in more detail with reference to the drawings.

Referring to FIGS. 1A to 1F, a negative photoresist 2a is preferably spin-coated on a substrate 1 such as a ceramic substrate, a semiconductor substrate, or the like, as shown in FIG. 1A. Then, a pattern is formed in the photoresist 2a using a photolithographic process. A window 3 is opened in an area where a wiring-pattern is to be formed [FIG. 1B]. In this case, the resist pattern 2, after the patterning has a reversely tapered shape to improve lift-off performance.

Figure 1C:
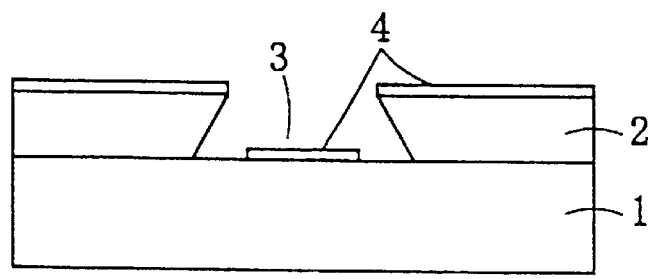

Subsequently, as shown in FIG. 1C, the substrate 1 is placed in the vacuum vapor deposition tank of an electron beam vapor deposition apparatus, a resistance heating vapor deposition apparatus, or a high frequency induction heating vapor deposition apparatus, and set on a substrate holder. Then, the substrate temperature is maintained at a temperature of 150° C. or less (if necessary, the substrate holder and the substrate are cooled with a proper cooling means such as cooling water or the like). A conductor (metal) is vapor-deposited on the substrate 1 under vacuum at a room temperature [FIG. 1C]. A conductive thin film 4 formed on the substrate 1 as described above may be composed of one layer or a plurality of layers.

Figure 1D:
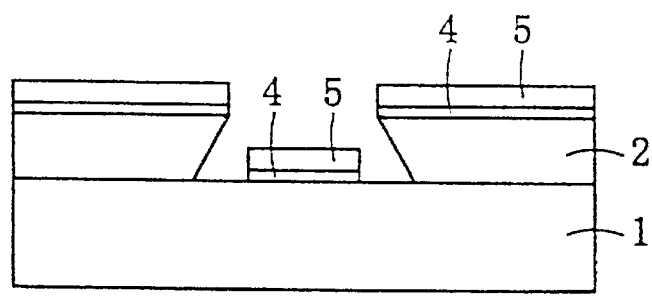

While the substrate 1 is located in the vacuum vapor deposition tank, the substrate temperature is maintained at 150° C. or less (again the substrate holder and the substrate are cooled with a proper cooling means such as cooling water or the like, if necessary), a dielectric thin film 5 is vapor-deposited on the substrate 1 under vacuum at room temperature [FIG. 1D]. The dielectric thin film 5 used in this case may be made of $CeO_2$, $Sm_2O_3$, $Dy_2O_3$, $Y_2O_3$, $TiO_2$, $Al_2O_3$, or MgO. A mixed composition thereof or a laminate structure can also be used.

Figure 1E:
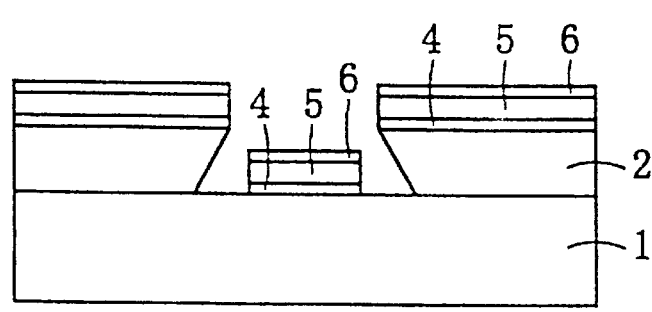
Figure 1F:
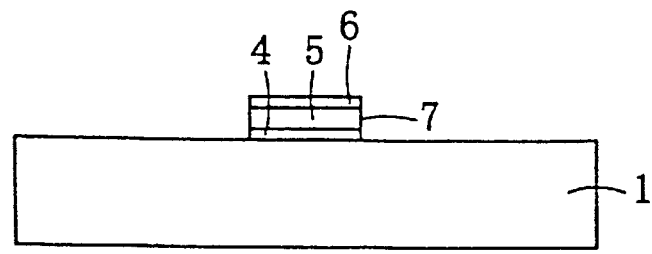

Thereafter, while the substrate 1 is located in the vacuum vapor deposition tank, the substrate temperature is maintained at 150° C. or less (once again the substrate holder and the substrate are cooled with a proper cooling means such as cooling water or the like, if necessary), a conductive metal is vapor-deposited on the substrate 1 under vacuum at room temperature, whereby a conductor thin film 6 is formed on the dielectric thin film 5 [FIG. 1E]. The conductor thin film 6 forms an upper layer and may be made of the same or different metal material from that of the conductor thin film 4 formed as the lower layer.

As described above, the laminate comprising the lower layer conductor thin film 4, the dielectric thin film 5, and the upper layer conductor thin film 6 is formed both on the resist pattern 2 and on the substrate 1 in the window 3 of the resist pattern 2. Then, the substrate 1 is dipped in a separation liquid which causes the laminate (4, 5, 6) located on the resist pattern 2 to be separated from the substrate 1 together with the resist pattern itself, whereby a laminate pattern 7 comprising the conductor thin film 4, the dielectric thin film 5, and the conductor thin film 6 is produced on the substrate 1, having a desired pattern for use as a wiring pattern in a high frequency device such as a high frequency transmission line, a high frequency resonator, a high frequency capacitance element, etc. [FIG. 1F].

According to the present invention, when any of $CeO_2$, $Sm_2O_3$, $Dy_2O_3$, $Y_2O_3$, $TiO_2$, $Al_2O_3$, and MgO is used as the dielectric material, room temperature vapor deposition for the low loss dielectric thin film is possible, and a high frequency low loss dielectric thin film pattern can be realized using the lift-off formation process. Since a dielectric film can be formed using lift-off technology, a laminate wiring pattern for an MIM capacitor, a high frequency transmission line, and so forth can be formed by patterning one time and separation working for the resist pattern. The laminate wiring pattern including the dielectric thin film can be formed at a low cost. In contrast, it is very difficult to pattern one side of 50 μm for example, through a metal mask, as conventionally done. If etching is employed for the patterning, it is necessary to carry out the resist patterning process and the etching process several times. This method is expensive.

The laminate pattern composed of the conductor thin film and the dielectric thin film has been described. However, needless to say, the present invention may be applied to the case where only the dielectric thin film pattern is used. In addition, a laminate pattern having four layers or more may be used.

FIRST EXAMPLE

Hereinafter, the formation of an MIM capacitor composed of an $Sm_2O_3$ film as a dielectric thin film and Cu films as upper, lower conductor thin films on a ceramic substrate, carried out by the above-described method, will be described.

First, a photoresist was coated onto a ceramic substrate with a diameter of 3 inches to have a film thickness of 5 μm. The photoresist was patterned using photolithography, whereby a resist pattern having an opening with one side of 50 μm was formed. In this case, the lithographic conditions were set so that the resist pattern took a sufficiently reversely tapered shape that the pattern can be lifted off.

Subsequently, the substrate having the resist pattern formed thereon was placed in the vacuum vapor deposition tank of a vapor deposition apparatus. Ti as an adhesion layer was vapor-deposited with electron beams to have a film thickness of 50 nm, and succeedingly, Cu was vapor-deposited with electron beams to have a film thickness of 300 nm whereby a conductor thin film lower layer (lower electrode) was formed. In this case, the temperature of the substrate was about 80° C. When the thickness of the Cu layer is large, the substrate temperature exceeds the limit (150° C.) of the heat resistance of the resist pattern. In this case, it is necessary to cool the substrate with cooling water or the like flowing through a substrate holder to keep the substrate temperature at a temperature of 150° C. or less.

After the conductor thin film was formed as the lower layer, Ti as an adhesion layer was vapor-deposited with electron beams to have a film thickness of 50 nm under vacuum without the substrate being exposed to the atmosphere (that is, without the substrate being taken out from the vacuum vapor deposition tank). Further, $Sm_2O_3$ was vapor-deposited with electron beams to have a film thickness of 200 nm whereby a dielectric thin film was formed. In this case, the substrate temperature was about 80° C. When the thickness of the $Sm_2O_3$ film is large, the substrate temperature becomes so high as to exceed the limit (150° C.) of the heat resistance of the resist pattern. In this case, the substrate temperature is inhibited and kept at a temperature of 150° C. or less by cooling the substrate.

Similarly, Ti as an adhesion layer was vapor-deposited with electron beams to have a film thickness of 50 nm on the $Sm_2O_3$ without the substrate being exposed to the atmosphere, namely, while it was held in the vacuum vapor deposition tank. Subsequently, Cu was vapor-deposited with electron beams to have a film thickness of 300 nm whereby a conductor thin film (conductor thin film upper layer) was formed as an upper layer. In this case, the temperature was about 80° C. When the thickness of the Cu film upper layer is large, the substrate temperature becomes so high as to exceed the limit (150° C.) of the heat resistance of the resist pattern. In this case, the substrate temperature is inhibited and maintained at 150° C. or less by cooling the substrate.

Thereafter, the substrate was taken out from the vacuum vapor deposition tank and dipped in acetone, and ultrasonic waves were applied, whereby the unnecessary Cu/Ti/$Sm_2O_3$/Ti/Cu/Ti deposited on the resist pattern was removed together with the resist pattern by lifting off. As a result, an MIM capacitor was produced in which the conductor thin films (Cu) were formed on both of the upper, lower sides of the dielectric thin film ($Sm_2O_3$) respectively.

Further, after the MIM capacitor was formed on the substrate as described above, the MIM capacitor on the substrate was annealed at 200° C. for 2 hours. As a result, the dielectric loss of the dielectric thin film [$Sm_2O_3$] was further improved.

SECOND EXAMPLE

Hereinafter, the case where a high frequency transmission line composed of an $Sm_2O_3$ film as a dielectric thin film and Cu films as conductor thin films placed on the upper, lower sides of the dielectric thin film, respectively, is formed on a ceramic substrate will be described.

First, a photoresist is coated onto a ceramic substrate with an diameter of 3 inches to have a film thickness of 5 μm. A pattern is formed on the photoresist using photolithography techniques whereby a resist pattern having an opening with a width of 500 μm and a length of 10 mm is formed. In this case, the lithographic conditions are set so that the resist pattern takes such a reversely tapered shape that it can be lifted off.

Subsequently, the substrate having the resist pattern formed thereon is placed in a vacuum vapor deposition tank of a vapor deposition apparatus. Ti as an adhesion layer is vapor-deposited with electron beams to have a film thickness of 50 nm, without heating the substrate, using the resist pattern as a mask, and succeedingly, Cu is vapor-deposited with electron beams to have a film thickness of 1 μm whereby a conductor thin film lower layer (lower electrode) is formed. In this case, the temperature of the substrate is about 80° C. When the thickness of the Cu layer is large, the substrate temperature becomes so high as to exceed the limit (150° C.) of the heat resistance of the resist pattern. In this case, it is necessary to cool the substrate e.g., using cooling-water or the like which flows through a substrate holder to keep the substrate temperature at 150° C. or lower.

After the conductor thin film is formed as the lower layer as described above, Ti is vapor-deposited with electron beams is an adhesion layer to have a film thickness of 50 nm under vacuum without the substrate being exposed to the atmosphere (that is, without the substrate being taken out from the vacuum vapor deposition tank). Further, $Sm_2O_3$ is vapor-deposited with electron beams to have a film thickness of 200 nm whereby a dielectric thin film is formed. In this case, the substrate temperature is about 80° C. When the thickness of the $Sm_2O_3$ film is large, the substrate temperature is so high as to exceed the limit (150° C.) of the heat resistance of the resist pattern. In this case, the substrate temperature is inhibited and maintained at a temperature of 150° C. or less by cooling the substrate.

Similarly, Ti as an adhesion layer is vapor-deposited with electron beams to have a film thickness of 50 nm on the $Sm_2O_3$ without the substrate being exposed to the atmosphere, namely, while it is held in the vacuum vapor deposition tank. Subsequently, Cu is vapor-deposited with electron beams to have a film thickness of 1 μm whereby a conductor thin film as an upper layer (upper electrode) is formed. In this case, the temperature is about 80° C. When the thickness of the Cu film upper layer is large, the substrate temperature is so high as to exceed the limit (150° C.) of the heat resistance of the resist pattern. In this case, the substrate temperature is inhibited and maintained at a temperature of 150° C. or less by cooling the substrate.

Thereafter, the substrate is taken out from the vacuum vapor deposition tank and dipped in acetone, and ultrasonic waves are applied, whereby the unnecessary $Cu/Ti/Sm_2O_3/Ti/Cu/Ti$ deposited on the resist pattern is removed together with the resist pattern by lifting off. As a result, a high frequency transmission line was produced in which the conductor thin films (Cu) were formed on both of the upper, lower sides of the dielectric thin film ($Sm_2O_3$), respectively.

After the high frequency transmission line was formed on the substrate as described above, the high frequency transmission line formed on the substrate was annealed at 200° C. for 2 hours. As a result, the dielectric loss of the dielectric thin film [$Sm_2O_3$] was further improved.

MEASUREMENT EXAMPLE

First, as materials other than the seven kinds of the dielectric materials used in the present invention, $SiO_2$ and $Ta_2O_5$ were selected. These materials were formed into a film by room temperature vapor deposition. The results were as follows;
$SiO_2$: tan δ=10%
$Ta_2O_5$: tan δ=60%
Thus, in both cases, a dielectric thin film having a large dielectric loss was produced.

In the case that $SiO_2$ and $Ta_2O_5$ were formed into a film by sputtering, the results were as follows:

$SiO_2$: tan δ=0.1%
$Ta_2O_5$: tan δ=0.3%
Accordingly, by sputtering, the dielectric thin films with a small dielectric loss could be produced.

On the other hand, with the above-described seven kinds of the dielectric materials, the dielectric thin films were formed by room temperature vapor deposition. The results were as follows;
$Al_2O_3$: tan δ=0.8%
$Y_2O_3$: tan δ=1.0%
$CeO_2$: tan δ=0.5–2.0%
$Sm_2O_3$: tan δ=0.5–2.0%
$Dy_2O_3$: tan δ=0.5–2.0%
$TiO_2$: tan δ=0.5–2.0%
MgO: tan δ=0.5–2.0%

These values are nearly equal to those obtained by sputtering. The dielectric losses are significantly improved as compared with those obtained by the same vapor deposition method.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A method of forming a dielectric thin film pattern, comprising the acts of:
    depositing a dielectric thin film on a substrate having a resist pattern thereon by a vapor deposition method, wherein at least one of $CeO_2$, $Sm_2O_3$, $Dy_2O_3$, $Y_2O_3$, $TiO_2$, $Al_2O_3$, and MgO is used as a material for the dielectric thin film; and
    removing the resist pattern whereby a patterned dielectric thin film is formed on the substrate.

2. A method of forming a dielectric thin film pattern according to claim 1, wherein the temperature of the substrate employed during the deposition of the dielectric thin film by the vapor deposition method is not more than 150° C.

3. A method of forming a dielectric thin film pattern according to claim 1, further comprising the step of subjecting the patterned dielectric thin film to heat treatment at a temperature of 150° C. or more.

4. A method of forming a laminate pattern comprising the steps of:
    sequentially depositing a dielectric thin film and a conductive thin film on the substrate having a resist pattern thereon by a vapor deposition method, wherein at least one of $CeO_2$, $Sm_2O_3$, $Dy_2O_3$, $Y_2O_3$, $TiO_2$, $Al_2O_3$, and MgO is used as a material for the dielectric thin film; and
    removing the resist pattern whereby the laminate pattern comprising the dielectric thin film and the conductor thin film is produced.

5. A method of forming a dielectric thin film pattern according to claim 4, wherein the temperature of the substrate employed during the deposition of the dielectric thin film by the vapor deposition method is not more than 150° C.

6. A method of forming a dielectric thin film pattern according to claim 4, further comprising the step of subjecting the laminate pattern to heat treatment at a temperature of 150° C. or more.

* * * * *